US007251802B2

(12) United States Patent
Hachiya et al.

(10) Patent No.: US 7,251,802 B2
(45) Date of Patent: Jul. 31, 2007

(54) METHOD AND SYSTEM FOR DECIDING A WIRING ROUTE

(75) Inventors: Ippei Hachiya, Atsugi (JP); Tetsuo Sasaki, Hadano (JP); Katsuyuki Itoh, Hadano (JP); Hiroyuki Suzuki, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/083,960

(22) Filed: Mar. 21, 2005

(65) Prior Publication Data

US 2005/0235243 A1    Oct. 20, 2005

(30) Foreign Application Priority Data

Mar. 19, 2004  (JP)  ............... 2004-079449

(51) Int. Cl.
*G06F 17/50* (2006.01)

(52) U.S. Cl. ...................................................... 716/15

(58) Field of Classification Search .............. 716/1–18; 703/14–18
See application file for complete search history.

(56) References Cited

U.S. PATENT DOCUMENTS

| 4,752,887 | A | * | 6/1988 | Kuwahara | 716/15 |
|---|---|---|---|---|---|
| 5,361,214 | A | * | 11/1994 | Aoki | 716/13 |
| 5,729,469 | A | * | 3/1998 | Kawakami | 716/13 |
| 6,643,839 | B1 | * | 11/2003 | Nishio et al. | 716/15 |
| 6,836,876 | B2 | * | 12/2004 | Suzuki et al. | 716/13 |
| 2003/0074638 | A1 | * | 4/2003 | Osaka et al. | 716/1 |
| 2003/0161124 | A1 | * | 8/2003 | Kariyazaki | 361/767 |
| 2003/0179551 | A1 | * | 9/2003 | Sugimoto et al. | 361/748 |
| 2004/0250230 | A1 | * | 12/2004 | Itou et al. | 716/15 |
| 2005/0204315 | A1 | * | 9/2005 | Knol et al. | 716/2 |

FOREIGN PATENT DOCUMENTS

JP      09-198423      7/1997

* cited by examiner

*Primary Examiner*—Paul Dinh
*Assistant Examiner*—Suchin Parihar
(74) *Attorney, Agent, or Firm*—Antonelli, Terry, Stout & Kraus, LLP.

(57) ABSTRACT

A wiring route deciding system, for a wiring board containing a multi-pin part, includes an input unit for receiving wiring board and wire connection information, wiring constraint information and wiring setting information, for example. The system further contains a draw wiring processing unit which decides a wiring route of a draw wiring from a part pin to a part periphery boundary based on wiring information inputted by the input unit, an inter-draw wire wiring processing unit which decides the wiring route taken between end points of the draw wiring decided by the draw wiring processing unit, and an output unit which outputs a wiring route information based on that decided by both the draw wiring processing unit and the inter-draw wire wiring processing unit. There is also provided a method counterpart for a wire routing scheme for a wiring board containing a multi-pin part.

8 Claims, 15 Drawing Sheets

METHOD AND SYSTEM FOR DECIDING A WIRING ROUTE

BACKGROUND OF THE INVENTION

The present invention relates to a method and a system for deciding a wiring route for obtaining a wiring pattern between terminals in the wiring design of a wiring board including a multi-pin part such as a multi-chip module (MCM) and a printed circuit board (PCB).

The conventional wiring design normally decides a wiring while evaluating the wiring cost. Furthermore, JP-A-9-198423 discloses a method in which the wiring order is decided in such a manner that a wiring pattern decided firstly will not cause a problem in deciding a later wiring pattern.

SUMMARY OF THE INVENTION

When the general route search algorithm is used, the shortest wiring route between terminals is assigned. Accordingly, in the conventional method, there is a possibility that an appropriate wiring result cannot be obtained when performing a wiring under the condition that no through hole is used for a signal for which the wiring characteristic such as a bus should be aligned. For example, as shown in the left diagram of FIG. 2, wire connection relationships intersect between a plurality of signals depending on the part direction and the terminal arrangement order. In this case, even by controlling the wiring order as shown in the right diagram of FIG. 2, it is difficult to align the wiring pattern.

Moreover, in the wire connection relationship as shown in the left diagram of FIG. 3, the wiring processing may result in an example of the right diagram of FIG. 3 where an unconnected signal is caused by the wiring route state decided previously.

Furthermore, there is a case when a plurality of signal groups such as bunched signals are used and such a constriction is posed that as compared to an interval between signal wires within the same signal group, an interval between signal wires between different signal groups should be greater. For example, as shown in FIG. 4, there are two types of signal groups: a signal group Y indicated by dotted lines 401, 403, 406, 408 and a signal group X indicated by solid lines 402, 404, 405, 407; and the minimum or limit value of the interval between signal wires of different groups is greater than the signal wire interval within the same wiring group. Thus, in order to satisfy the signal wire interval restriction between the different groups, i.e., between 401 and 402, between 402 and 403, between 405 and 406, between 406 and 407, and between 407 and 408, a large wiring area is required for the wire intervals, which, in turn, reduces the other wiring area.

It is therefore an object of the present invention to decide a wiring route drawing from a part eliminating intersections between wire connection relationships caused by the part direction and the terminal arrangement order, thereby reducing the wiring layer and increasing the mounting density.

According to the present invention, in order to eliminate intersections between the wire connection relationships, the wire drawing processing from a part terminal is performed prior to the entire wiring. Furthermore, in order to optimally perform the wire drawing processing, the wiring is performed by moving the part connected to the wiring object onto a virtual wiring board.

When moving the part from the real wiring board, the area around the part is cut out from the real wiring board and moved onto the virtual wiring board. On the virtual wiring board, the part direction is set to the appropriate state for the wiring by rotating and parallel-displacing the part before deciding the wire drawing direction and performing the wiring between the terminals. The wire drawing processing is complete by returning the wiring information contained in the area cut out from the real wiring board from the virtual wiring board to the real wiring board.

Lastly, by using the wire drawing result obtained in the wire drawing processing, wiring is performed between parts on the real wiring board.

According to the present invention, it is possible to align the bus wiring characteristics by eliminating the intersections between the wire connection relationships and to increase the wiring density. Thus, it is possible to reduce the wiring layer used and reduce the production cost.

DESCRIPTION OF THE EMBODIMENTS

Description will now be directed to embodiments of the present invention with reference to the attached drawings.

(1) Embodiment 1

Figure 1:
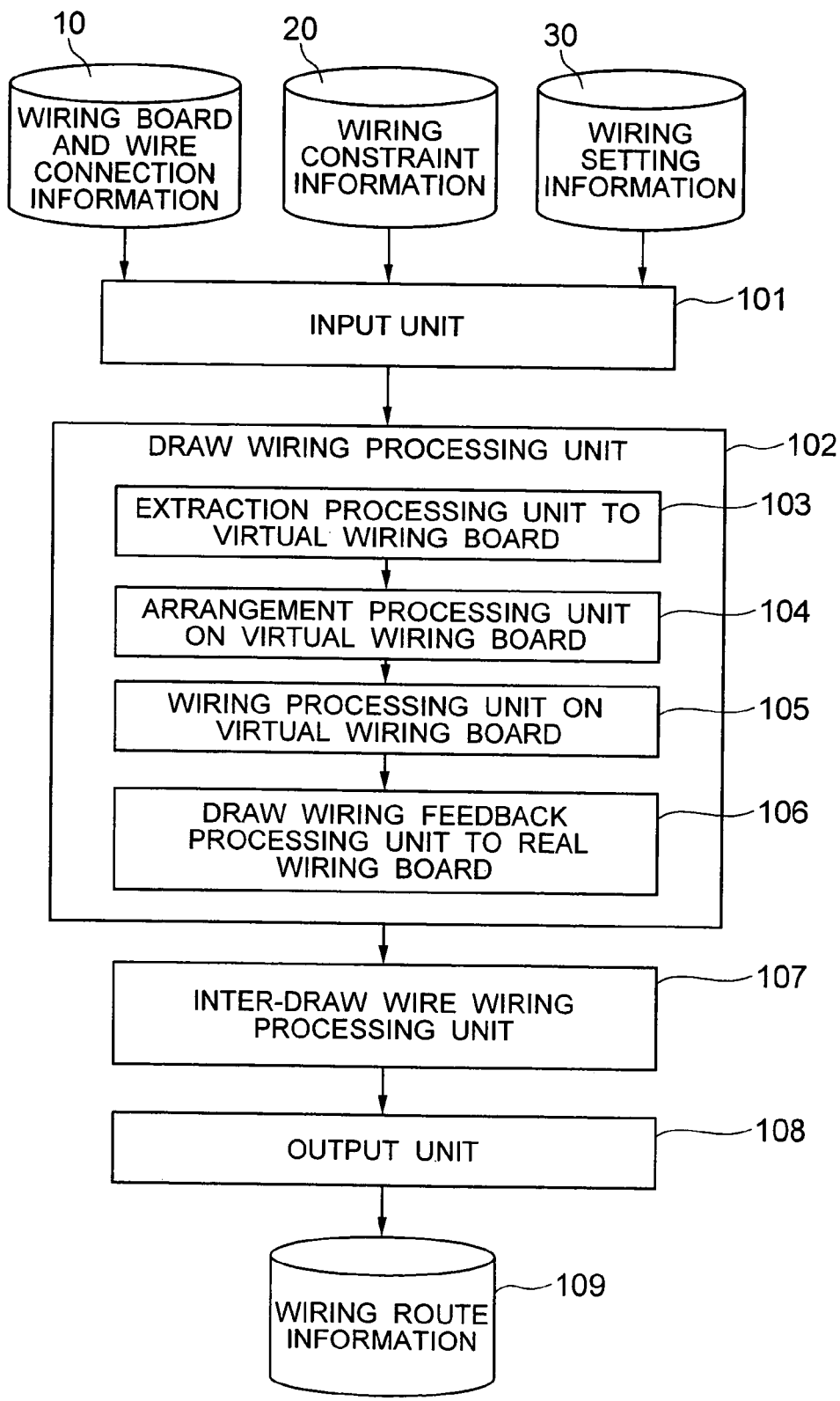
FIG. 1 shows an example of a system configuration according to a first embodiment of the present invention.
Figure 2:
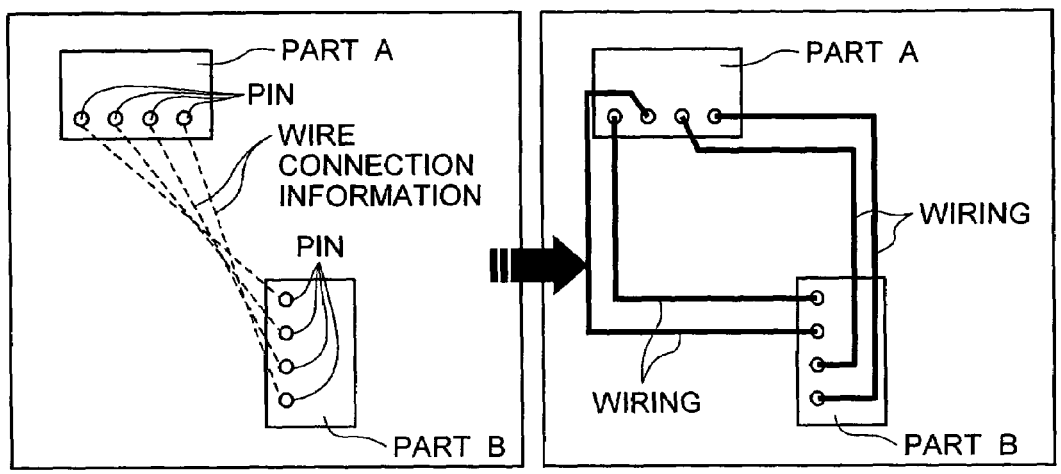
FIG. 2 shows a wiring example 1 in the conventional technique.
Figure 3:
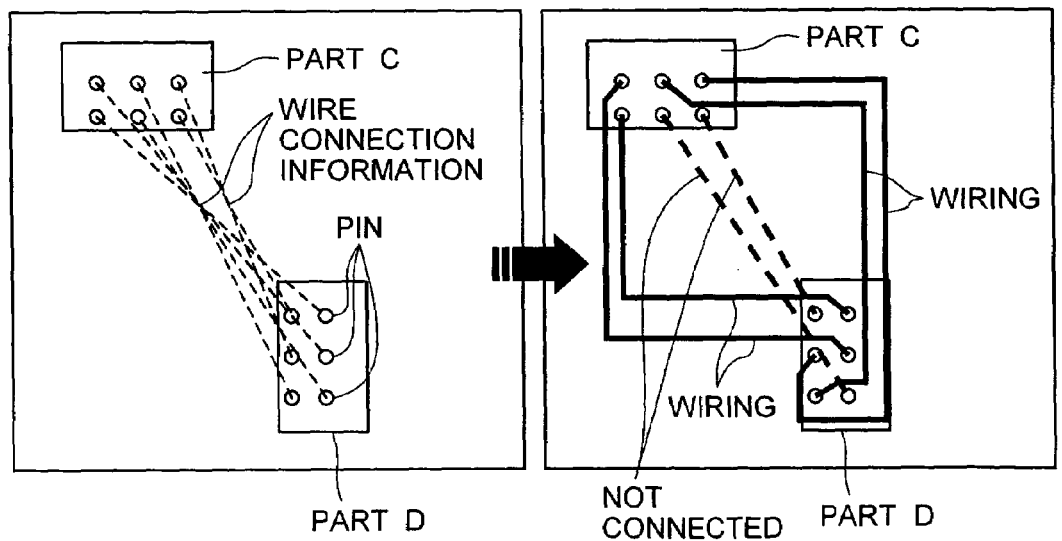
FIG. 3 shows a wiring example 2 in the conventional technique.

FIG. 1 shows a procedure of the method for deciding a wiring route according to the first embodiment of the present invention. An input unit 101 is used to receive: wiring board and wiring connection information 10 such as a wiring board shape, a wiring inhibited area, a part shape, part position information, pin position information, inter-pin connection information (hereinafter, referred to as connection information); wiring constraint information 20 such as bunch signal information, wiring width, wiring interval length, pair wiring instruction, and wiring inhibited information on wiring using a through hole; and wiring setting information 30 required when performing draw wiring processing such as a wiring margin area and wiring order information when performing draw wiring processing.

A draw wiring processing unit 102 is used to perform drawing of a wire from a pin to a part periphery boundary (hereinafter, referred to as draw wiring) by using a virtual wiring board. The draw wiring processing unit includes four processing units: an extraction processing unit 103 to the virtual wiring board, an arrangement processing unit 104 on the virtual wiring board, a wiring processing unit 105 on the virtual wiring board, and a draw wiring feedback processing unit 106 to the real wiring board. The draw wiring processing unit decides the draw wiring route of the part connected to the object net groups performing the draw wiring processing. Hereinafter, explanation will be given on each of the four processing units.

The extraction processing unit 103 to the virtual wiring board arranges cut-out information on the area of the part connected to the signal group which is added by the wiring margin area specified by the input unit (hereinafter, referred to as part area) onto the virtual wiring board. Here, information on the wiring-inhibited area and the existing wiring contained in the part area is also extracted and arranged together with the part information on the virtual wiring board.

The arrangement processing unit 104 on the virtual wiring board performs arrangement processing such as movement and rotation so that the direction of each of the parts the pins are arranged in an ideal state on the virtual wiring board.

The wiring processing unit 105 on the virtual wiring board decides a wiring route between the parts arranged on the virtual wiring board by the arrangement processing unit 104.

The draw wiring feedback processing unit 106 to the real wiring board cuts out the part area from the wiring result by the wiring processing unit 105 on the virtual wiring board and performs feedback processing of the draw wiring information from the pins of the part to the real wiring board. By performing the aforementioned four procedures, the part draw wiring processing is complete.

An inter-draw wire wiring processing unit 107 decides the wiring route between terminals of the draw wiring obtained by the draw wiring processing unit 102.

An output unit 108 outputs the wiring route information 109 decided by the draw wiring processing unit 102 and the wiring processing unit 107 between draw wires.

Thus, the wiring processing between the parts is complete.

Next, by referring to FIG. 5 to FIG. 9, explanation will be given on the operation of each of the processing units shown in FIG. 1.

Figure 5:
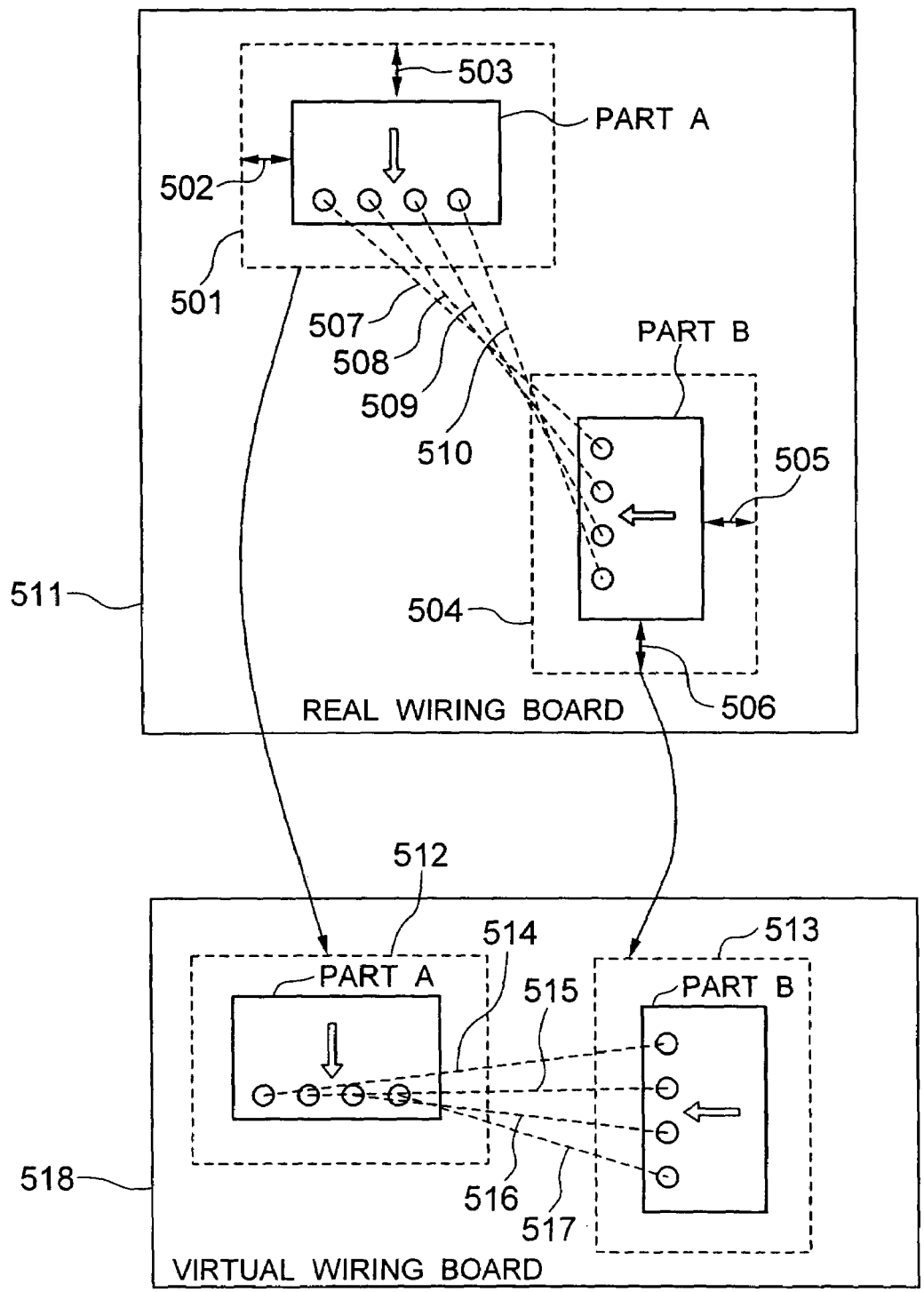
FIG. 5 explains an extraction processing unit to a virtual wiring board according to the present invention.

FIG. 5 explains the extraction processing unit 103 to the virtual wiring board. 511 denotes a real wiring board. On this real wiring board, a part A and a part B as the multi-pin parts are arranged and the connection relationship between the terminals are shown by broken lines 507 to 510. Here, when the draw wiring of four signals connected to the part A and the part B are to be processed, and the X-axis component and the Y-axis component of the wiring margin of the part A are 502 and 503, respectively, while the X-axis component and the Y-axis component of the wiring margin of the part B are 505 and 506, respectively, the part areas 501 and 504 including these margins are cut off and arranged on 512 and 513 of the virtual wiring board 518. At this time, the connection information indicated by broken lines 514 to 517 is simultaneously extracted.

Figure 6:
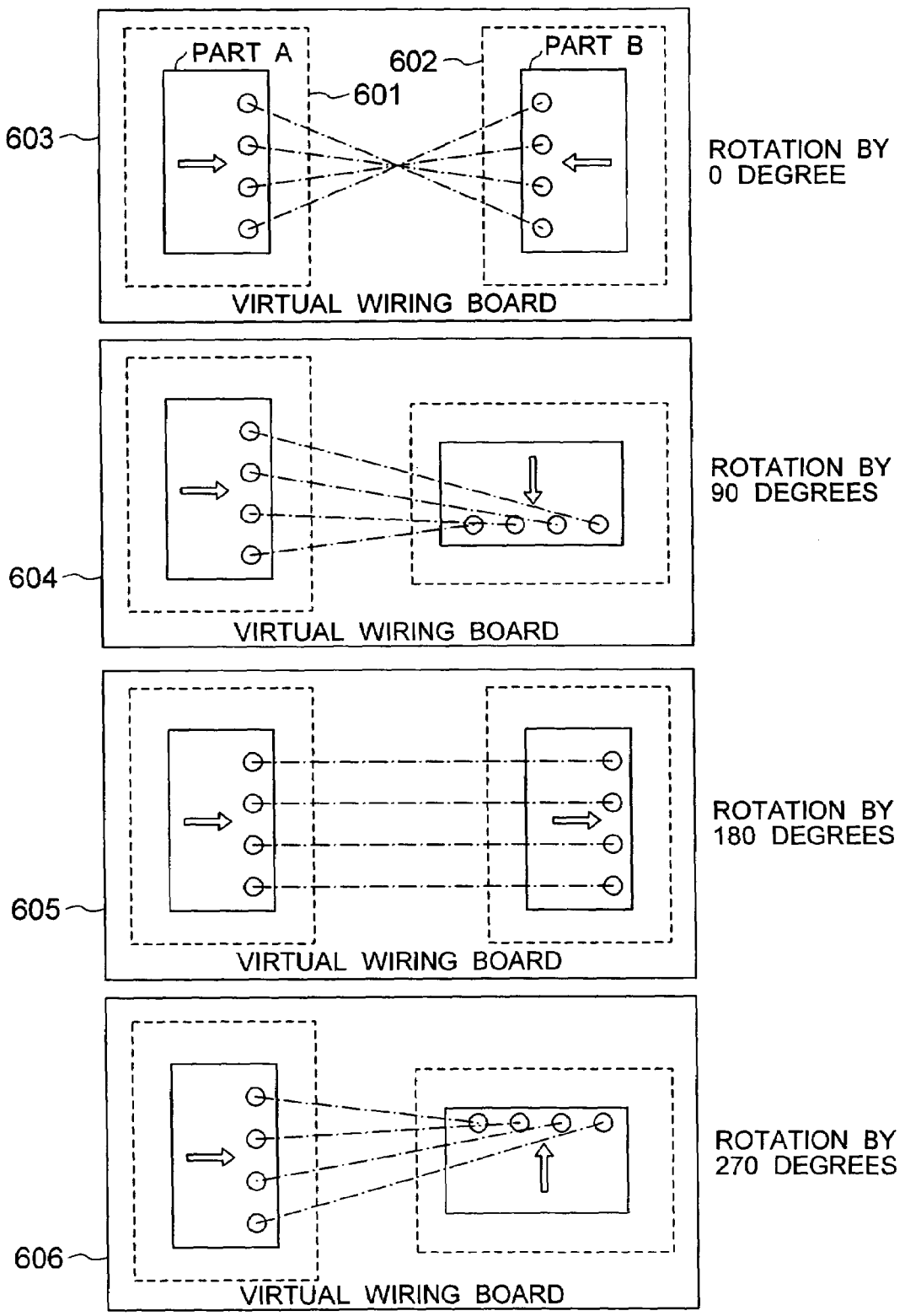
FIG. 6 explains an arrangement processing unit on the virtual wiring board according to the present invention.

FIG. 6 explains operation of the arrangement processing unit 104 on the virtual wiring board. The arrangement processing unit 104 performs processing for arranging the part areas extracted onto the virtual wiring board at appropriate positional relationship on the virtual wiring board. According to the coordinates of the pins to be wired and the spread of the pin positions, the draw directions from the respective parts are decided and the arrangement is made so that the draw directions face to each other.

Here, the cut-out areas are arranged at a certain distance so that the wiring routes of the net to be processed can be arranged between the cut-out areas. After the arrangement is complete, one of the parts is rotated and the number of intersections and the distance irregularities between the wires connecting the terminals are calculated. The positional relationship to minimize these values is decided. FIG. 6 shows an example in which the two part areas extracted from the real wiring board are extracted onto the virtual wiring board and they are rotated and moved on the virtual wiring board. Firstly, the part A is arranged so that the direction of the side where terminals are concentrated is the draw direction. Next, when arranging the part B on the virtual wiring board, a space between the part area 601 of the part A already arranged and the part area 602 of the part B is set to be sufficient so that the signal wiring routes to be processed can be arranged between them.

Next, while the part A is fixed, the part B is rotated by 90 degrees repeatedly and the number of intersections and irregularities are evaluated. 603, 604, 605, and 606 show the states of the virtual wiring board where the part B is rotated by 0 degree, 90 degrees, 180 degrees, and 270 degrees. In this case, the state where the part B is rotated by 180 degrees is decided to be the most appropriate positional relationship because the number of intersections and the wiring irregularities are minimized. In this embodiment, the rotation is performed stepwise by 90 degrees. However, it is also possible to perform rotation by other angles.

Figure 7A:
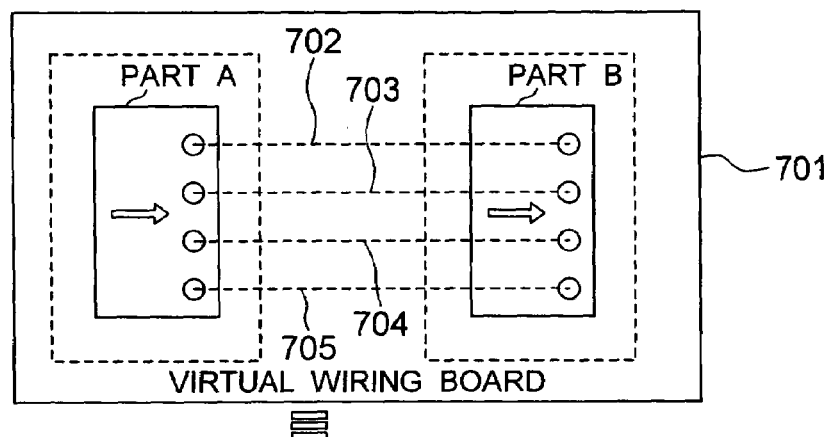
FIGS. 7A to 7C explain an arrangement processing unit on the virtual wiring board according to the present invention.
Figure 7B:
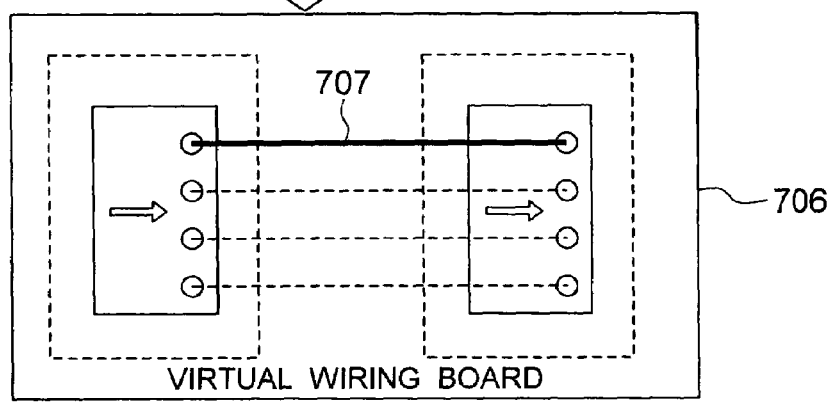
Figure 7C:
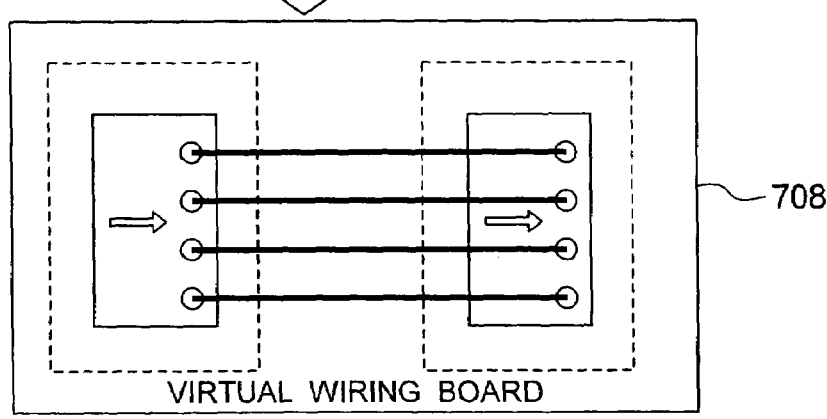

FIG. 7 explains the wiring processing unit 105 on the virtual wiring board. 701 shows the state in which the arrangement processing by the arrangement processing unit 104 is complete and the parts and part areas are arranged on the virtual wiring board. 702 to 705 shows wire connection information. For these signals. wiring processing is performed. 706 shows that wiring processing has been performed to the wire connection information 702. 708 shows the state in which wire connection processing is complete for all the nets to be wired and the processing by the wiring processing unit 104 is complete.

Figure 8:
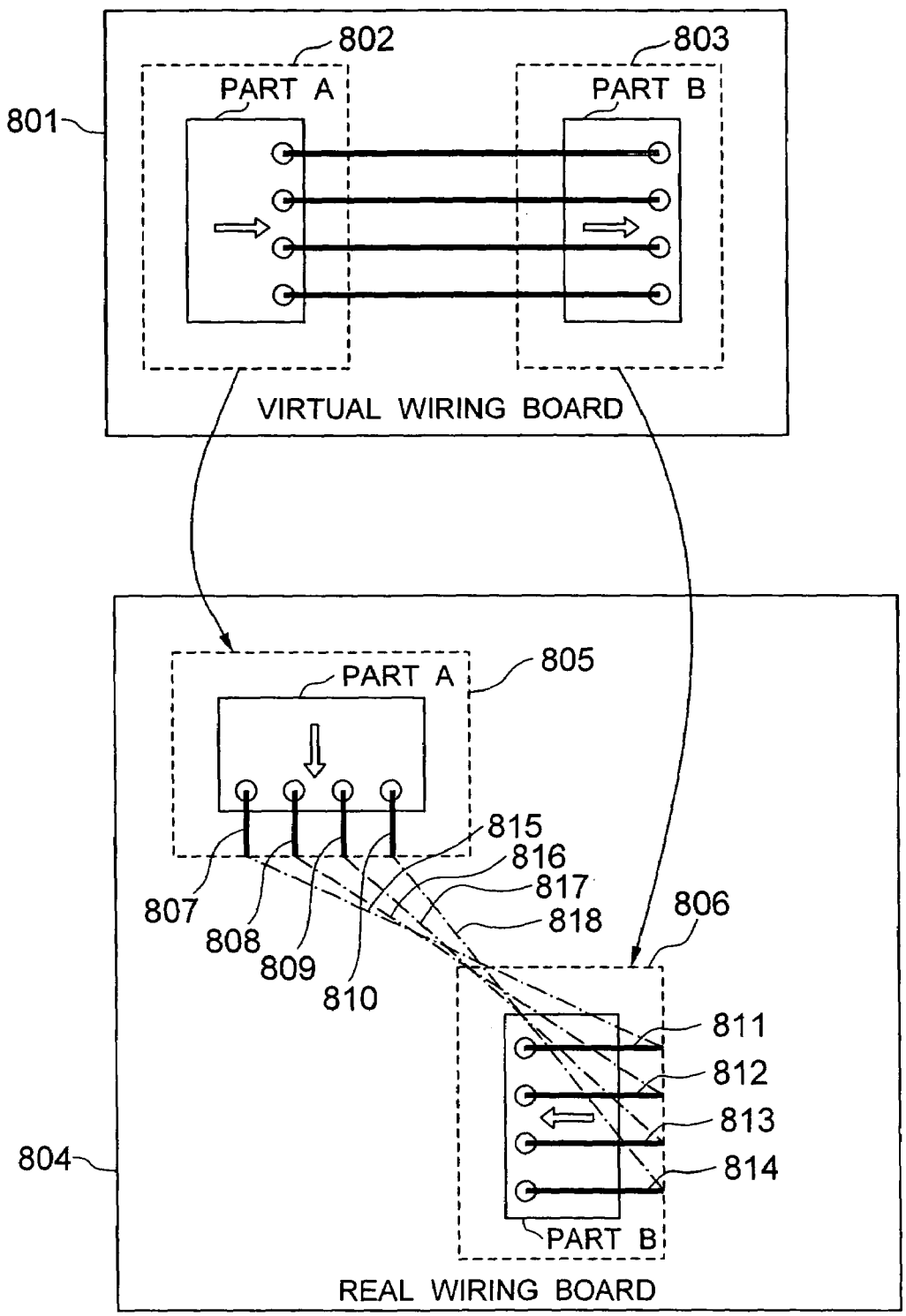
FIG. 8 explains a wire drawing feedback processing unit to the real wiring board according to the present invention.

FIG. 8 explains the draw wiring feedback processing unit 106 to the real wiring board. 801 shows the state in which the wiring processing on the virtual wiring board is complete. The wiring information contained in the part areas 802 and 803 cut out onto the virtual wiring board from the real wiring board is fed back to the areas 805 and 806 on the real wiring board 804. Here, the part areas 802 and 803 which have been rotated on the virtual wiring board are returned to the directions on the real wiring board and fed back as 805 and 806, respectively.

807 to 810 and 811 to 814 are draw wiring information cut out by the feedback processing. Here, the boundary between the wiring areas and the end points as contact points of the draw wiring are the wire connection information. 815 to 818 show updated wire connection information.

Figure 9:
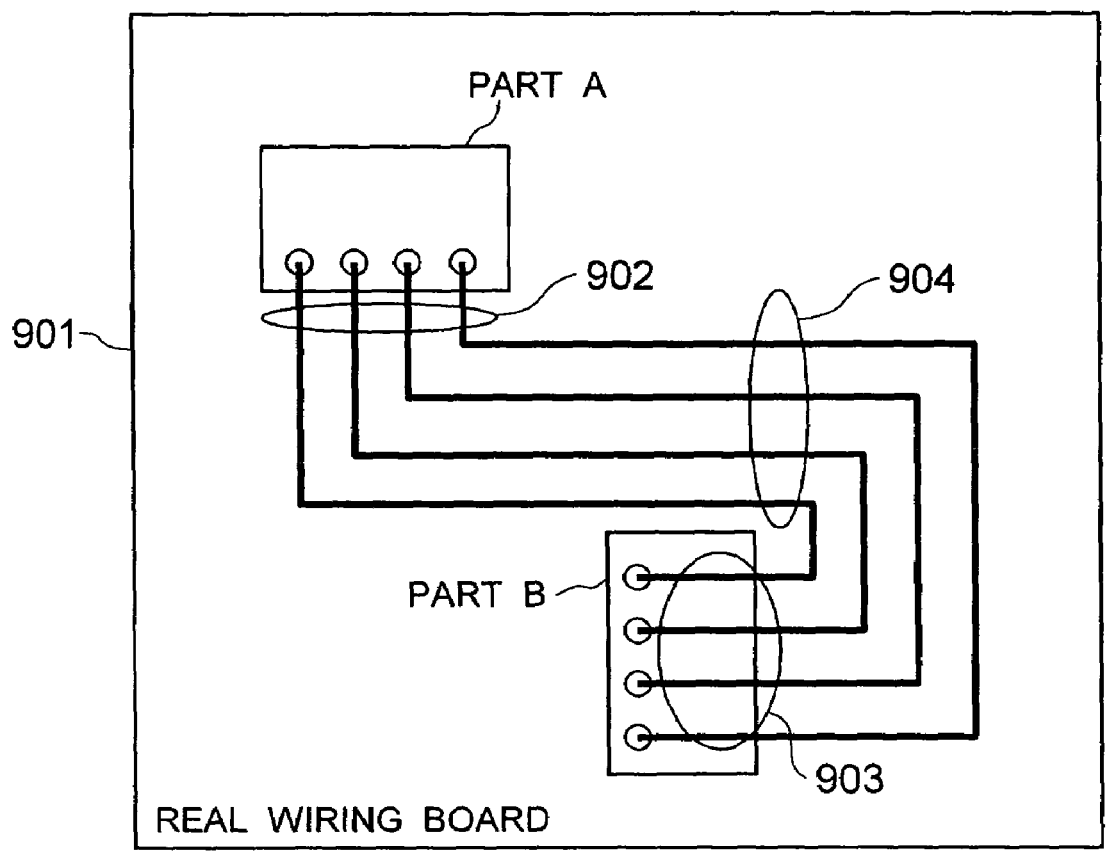
FIG. 9 explains a wiring processing unit between the drawing wires according to the present invention.

FIG. 9 explains the wiring processing unit 107 between the draw wires. 901 indicates a real wiring board. Between the end points of draw wiring result 902 of the part A and the draw wiring result 903 of the part B, wiring processing is performed according to the wire connection information 815 to 818 on the real wiring board shown in the lower half of FIG. 8. 904 shows the result of the wiring processing between the draw wires.

(2) Embodiment 2

Figure 10:
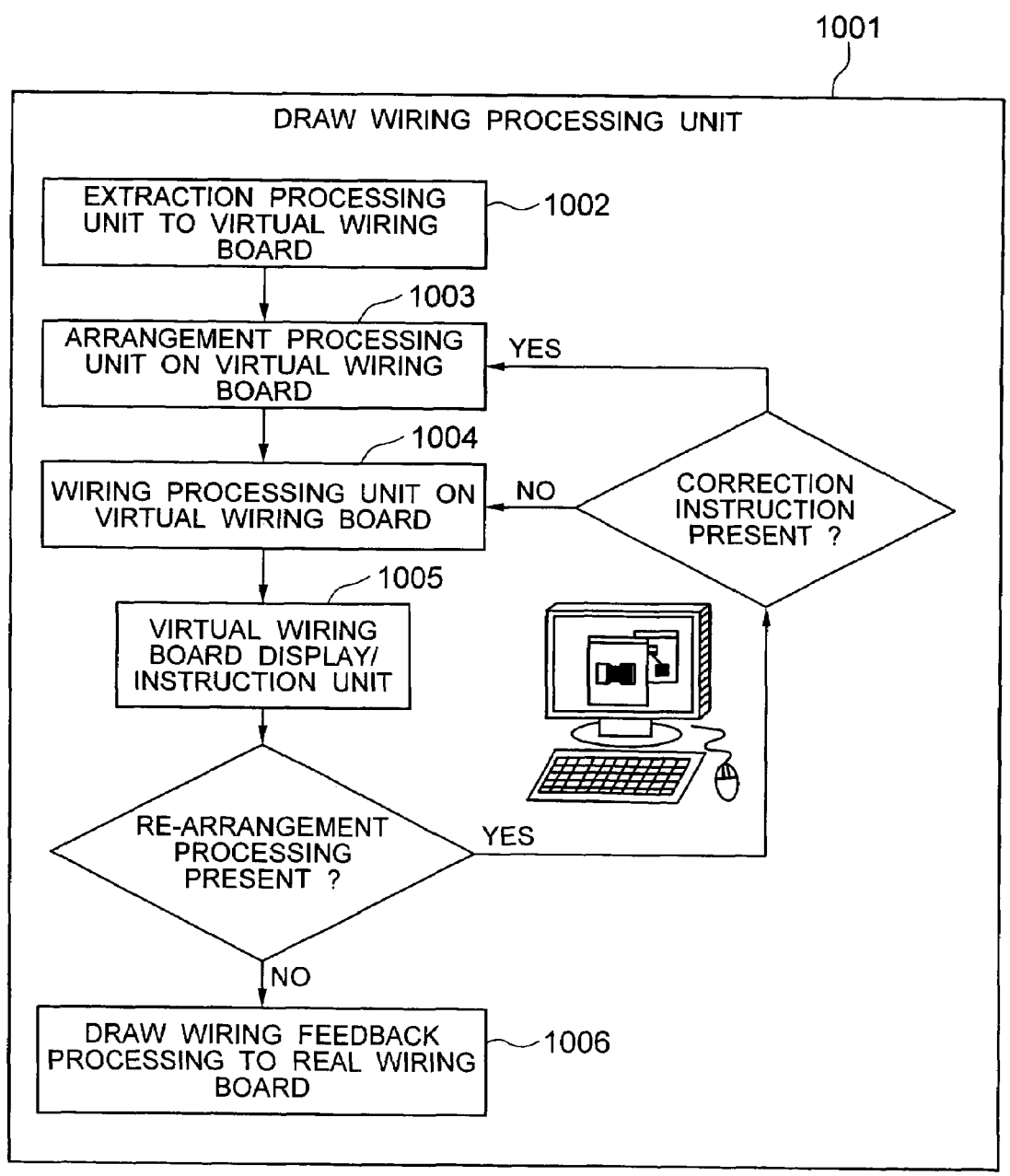
FIG. 10 is a flowchart of the wire drawing processing unit according to a second embodiment of the present invention.
Figure 11A:
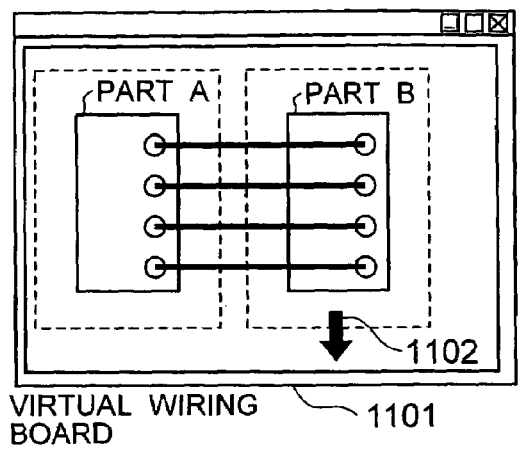
FIGS. 11A to 11F explain the virtual wiring board display/instruction unit of the present invention.
Figure 11B:
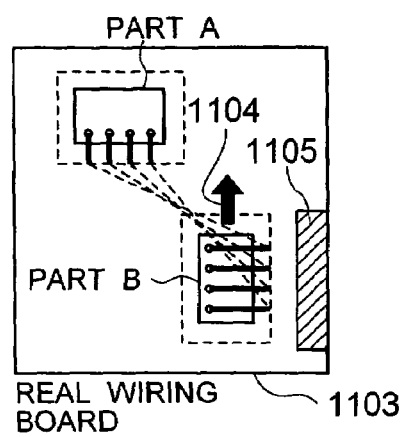
Figure 11C:
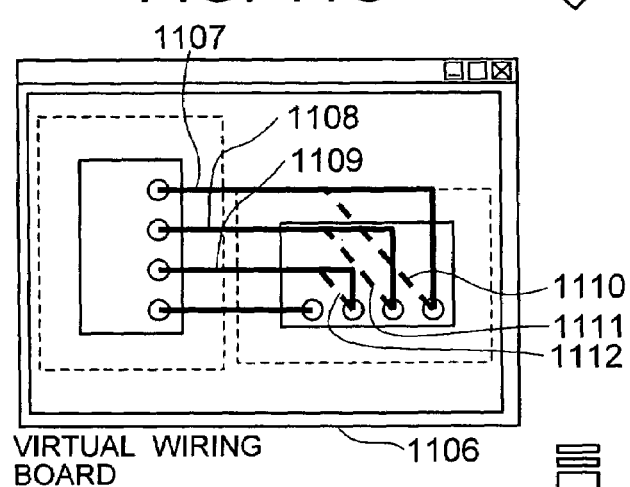
Figure 11D:
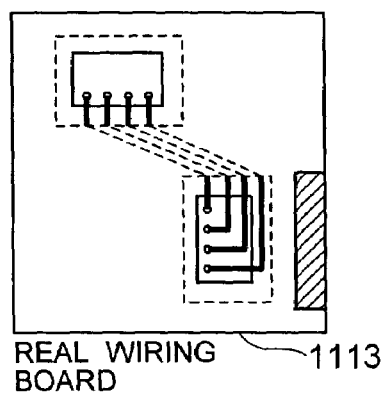
Figure 11E:
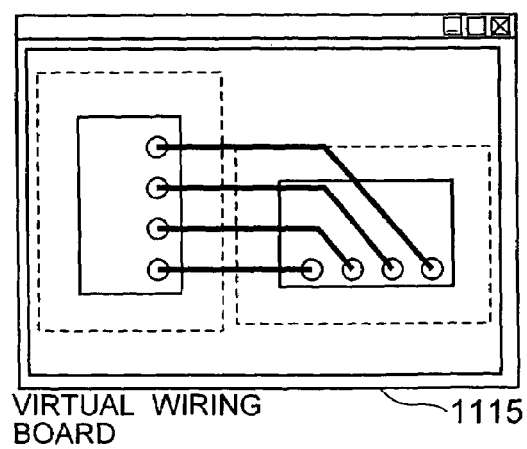
Figure 11F:
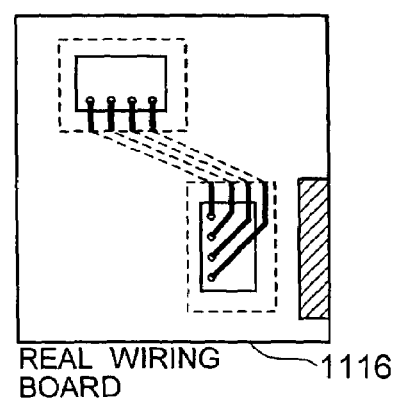

FIG. 10 is a flowchart for displaying and correcting the result on the virtual wiring board by using the virtual wiring board display/instruction unit 1005 according to a second embodiment of the present invention. 1001 corresponds to the draw wiring processing unit 102 of the first embodiment shown in FIG. 1. Explanation will be given on this draw wiring processing.

An extraction processing unit 1002 to the virtual wiring board, an arrangement processing unit 1003 on the virtual wiring board, a wiring processing unit 1004 on the virtual wiring board, and a draw wiring feedback processing unit 1006 to the real wiring board are equivalent to 103, 104, 105, and 106 explained in the first embodiment, respectively.

1005 denotes a virtual wiring board display/instruction unit for displaying the wiring result by the draw wiring processing unit 1004 on the virtual wiring board. Moreover, for the display result, 1005 corrects the arrangement position and the rotation direction of the parts, the draw wiring direction, the wiring layer, and the wiring route or gives these information as instruction information to again instruct the draw wiring processing. When a correction is instructed, it is judged whether re-arrangement is required. If required, re-processing is executed by passing control to the arrangement processing unit 1003 on the virtual wiring board or the wiring processing unit 1004 on the virtual wiring board.

Next, referring to FIG. 11, explanation will be given on the operation of the second embodiment. An example given here relates to a draw wiring direction modification instruction and a draw wiring route modification instruction on the virtual wiring board.

1101 shows a display example of the virtual wiring board on which a wire connection result between a part A and a part B is shown. Moreover, 1103 shows a real wiring board onto which the draw wiring result of 1101 is fed back. Here, since an obstacle 1105 such as a wiring inhibited area exists in the draw wiring direction of the part B on the real wiring board, it seems difficult to perform wiring between the draw wires. To cope with this, it is instructed to correct the draw wiring direction of the part B to 1104, i.e., the direction of 1102 on the virtual wiring board, thereby performing rearrangement and re-wiring by the draw wiring processing unit 1001.

The draw wiring result by this is shown in 1106. Moreover, 1113 shows the real wiring board to which the draw wiring result of 1106 is fed back. By the aforementioned draw wiring direction correction instruction, a draw wiring route not passing the wiring inhibited area is assured but a part of the draw wiring route has become relatively longer. To cope with this, the wiring route is directly corrected on the virtual wiring board. Here, the draw wiring routes 1107, 1108, and 1109 are corrected to 1110, 1111, and 1112.

The re-draw wiring processing result by this on the virtual wiring board is shown in 1115. Moreover, 1116 shows the real wiring board to which the draw wiring result of 1115 is fed back.

(3) Embodiment 3

Figure 12:
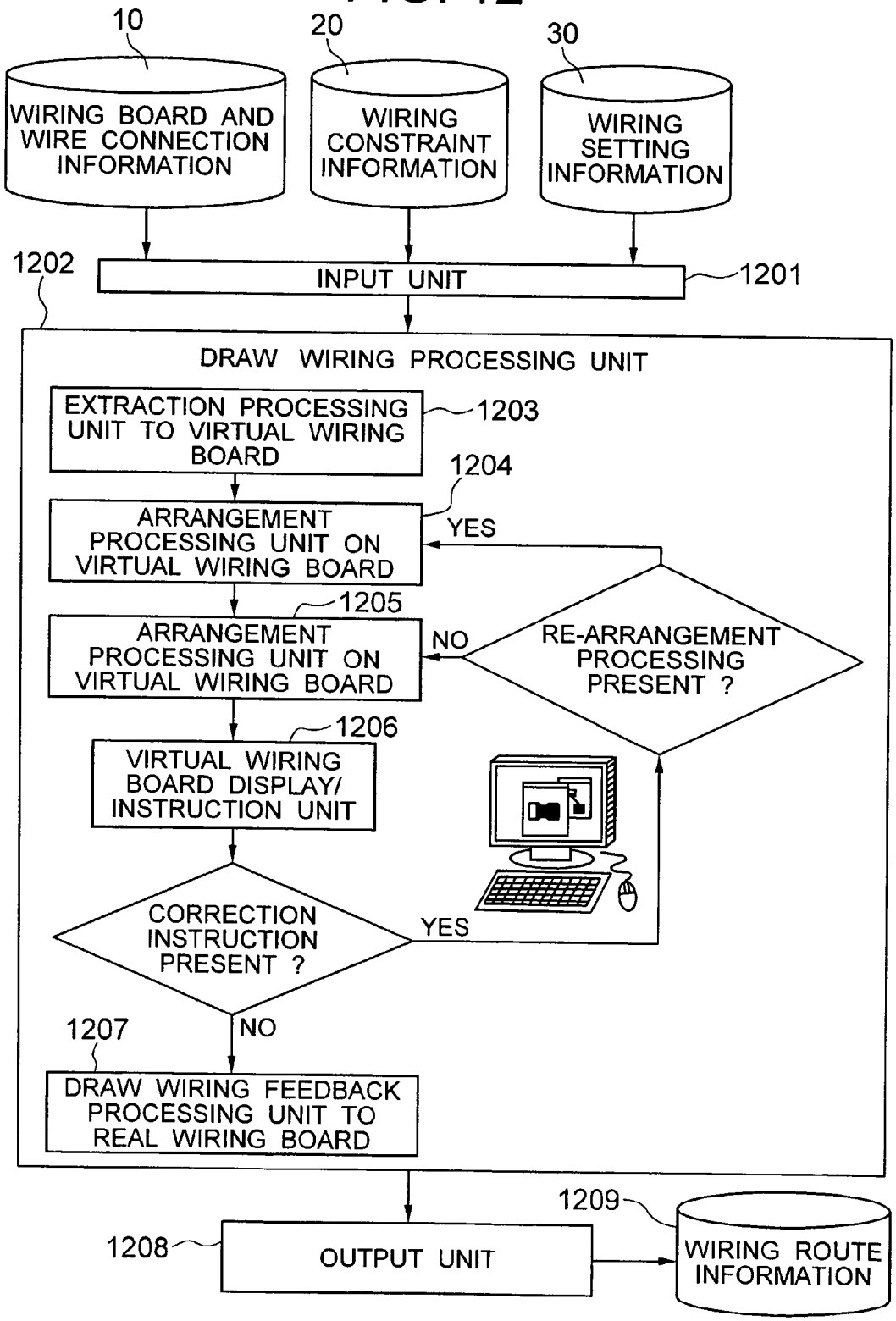
FIG. 12 shows an example of a system configuration according to a third embodiment of the present invention.

FIG. 12 shows a system configuration according to a third embodiment of the present invention. The first embodiment and the second embodiment are examples in which the draw wiring result on the virtual wiring board is fed back to the real wiring board (106) and then wiring processing between the draw wires is performed on the real wiring board (107). However, it is possible to provide a system not performing the wiring between the draw wires (107). In this case, the wiring between the draw wires may be performed by using an ordinary wiring processing tool.

1201 denotes an input unit which receives wiring board and wire connection information 10, wiring constraint information 20 and wiring setting information 30.

1202 denotes a draw wiring processing unit which includes the following five processing units: an extraction processing unit 1203 to the virtual wiring board, an arrangement processing unit 1204 on the virtual wiring board, a wiring processing unit 1205 on the virtual wiring board, a virtual wiring board display/instruction unit 1206, and a draw wiring feedback processing unit 1207 to the real wiring board.

1208 denotes an output unit which outputs the wiring route information 1209 decided by the draw wiring processing unit 1202. The respective processing units execute the same processing as the first and the second embodiment.

(4) Embodiment 4

Figure 13:
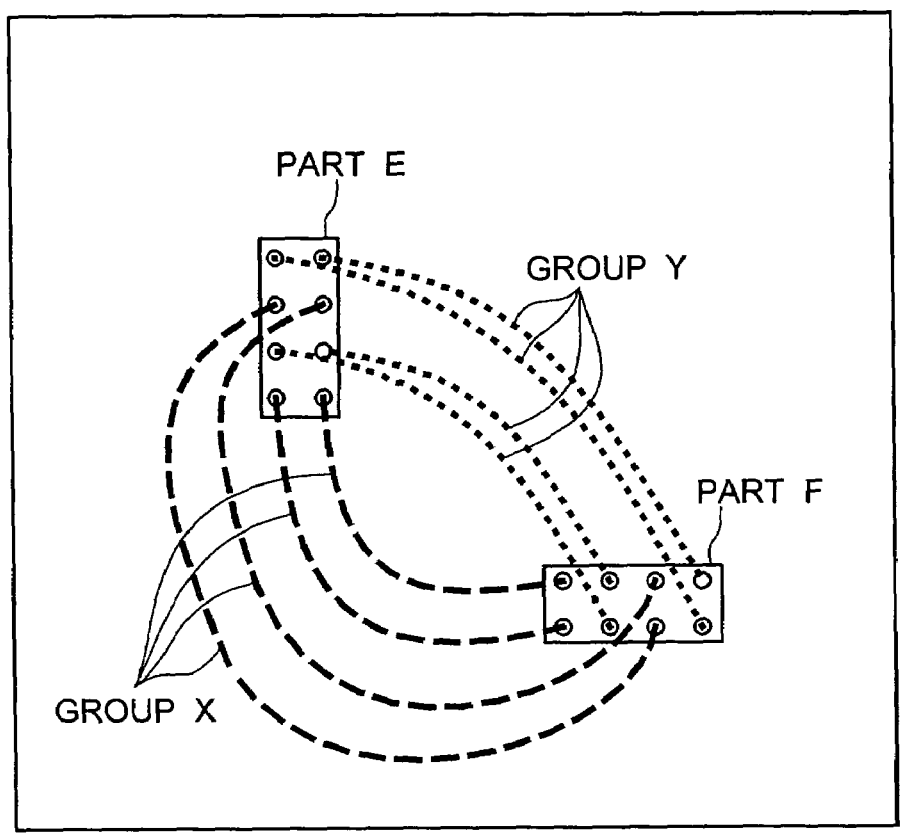
FIG. 13 shows an example having a wiring constraint according to a fourth embodiment of the present invention.
Figure 14:
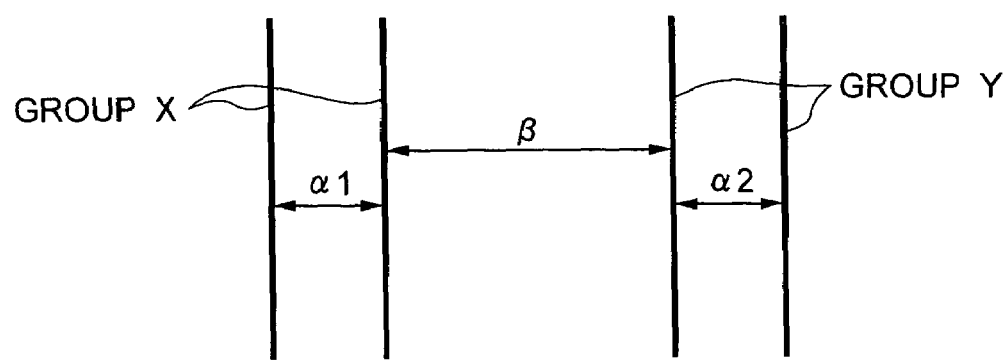
FIG. 14 explains the wiring constraint according to the fourth embodiment of the present invention.

Next, explanation will be given on a fourth embodiment of the present invention. FIG. 13 shows an example of wiring board having a wiring constraint. A group X and a group Y are signal groups. FIG. 14 shows the wiring constraint between these signals. The limit values of the adjacent wire interval between wires of the signals in the signal group X and the signal group Y are indicated by $\alpha 1$ and $\alpha 2$. The limit value of the adjacent wire interval between the signal group X and the signal group Y is indicated by $\beta$. However, where the wire length of a parallel portion is short, the limit value may be decreased.

Figure 15:
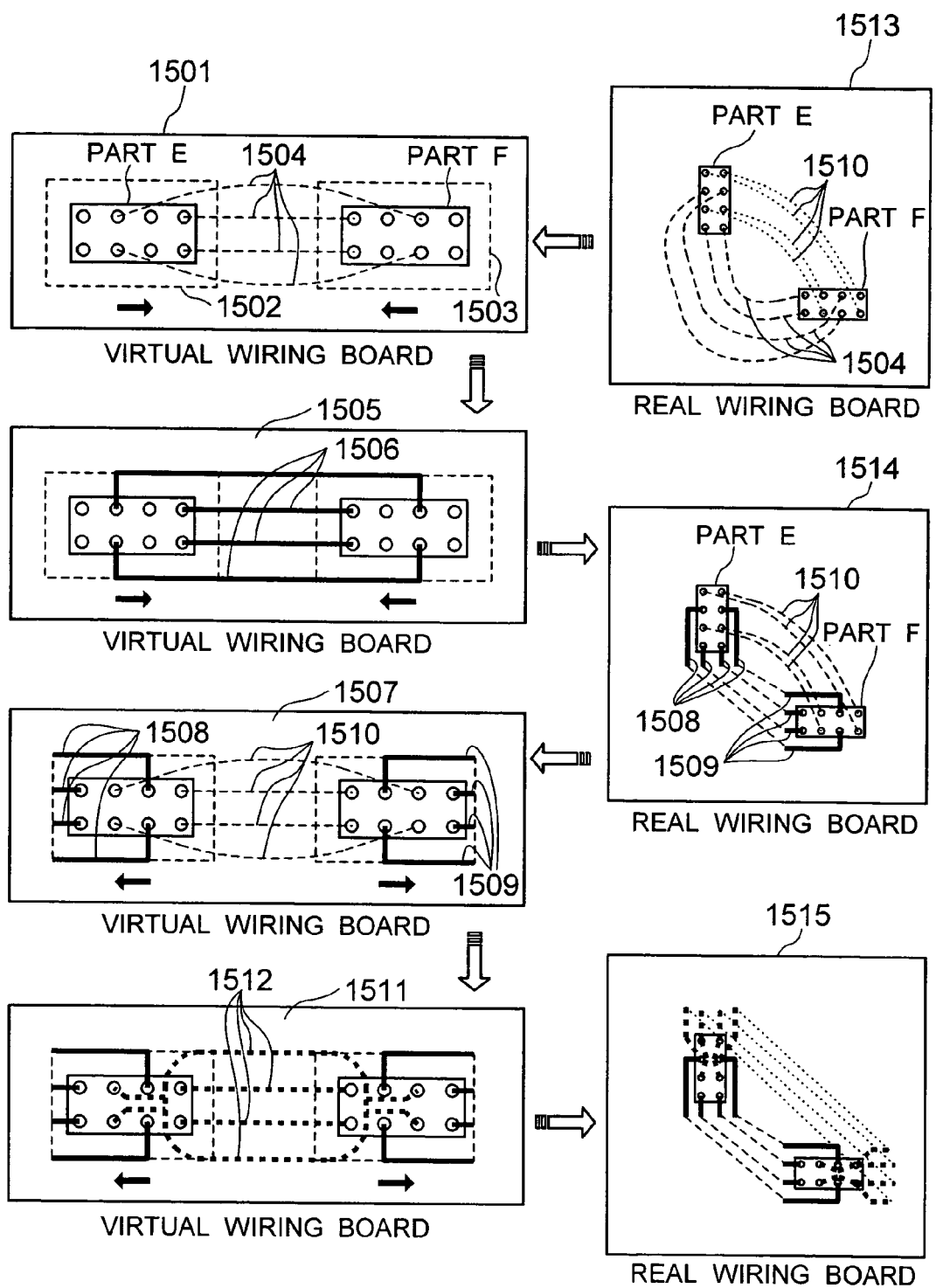
FIG. 15 explains a wiring processing unit having the wiring constraint according to the fourth embodiment of the present invention.

FIG. 15 explains the operation of the wiring processing unit 105 on the virtual wiring board in the draw wiring processing unit 102 of FIG. 1 when the wiring board has a wiring limit concerning the adjacent signals. 1513 denotes a real wiring board, on which a part E and a part F are arranged and the wire connection information is indicated by the broken lines 1504 and 1510. 1501 is a virtual wiring board containing the part E and the part F on the real wiring board which have been subjected to the processing by the extraction processing unit 103 to the virtual wiring board of the draw wiring processing unit 102 on the virtual wiring board shown in FIG. 1 and the processing by the arrangement processing unit 104 on the virtual wiring board. Here, 1502 and 1503 shows the part areas of the part E and the part F. 1504 shows wire connection information on the signal wires of the signal groups to be wired. It should be noted that it is assumed that a limit value is present on the signal arrangement interval in the signal group 1504. Wiring processing is performed on the virtual wiring board under this condition.

1505 denotes a virtual wiring board on which the processing to the state of 1501 by the wiring processing unit 105 on the virtual wiring board shown in FIG. 1 is complete.

1506 denotes wiring routes, which satisfy the limit on the aforementioned wire interval. After this, the processing by the draw wiring feedback processing unit 106 to the real wiring board shown in FIG. 1 is performed and the wiring routes contained in the part areas are reflected on the real wiring board.

1507 denotes a virtual wiring board on which the part E and the part F of the real wiring board 1514 after the completion of the aforementioned feedback processing have been subjected to the processing by the extraction processing unit 103 for the signal group 1510 onto the virtual wiring board and the processing by the wiring processing unit 104 on the virtual wiring board. Here, it is assumed that the directions of the part E and the part F rotated by 180 degrees from the directions on the virtual wiring board 1505 are selected to be optimal. Moreover, 1508 and 1509 are existing wiring information contained in the part areas when extracted from the real wiring board. Moreover, 1510 indicates the wire connection information on the signal wires of the signal groups to be wired.

1511 is a virtual wiring board on which the processing by the wiring processing unit 105 on the virtual wiring board shown in FIG. 1 is complete as compared to the state of 1507. 1521 denotes wiring routes, which satisfy the limit value of the adjacent wire intervals between the existing wires 1508 and 1509. After this, processing by the draw wiring feedback processing unit 106 to the real wiring board shown in FIG. 1 is performed and the wiring routes contained in the part areas are reflected on the real wiring board. The result is shown in FIG. 1515. Thus, all the draw wiring processes to be performed are complete.

Figure 16A:
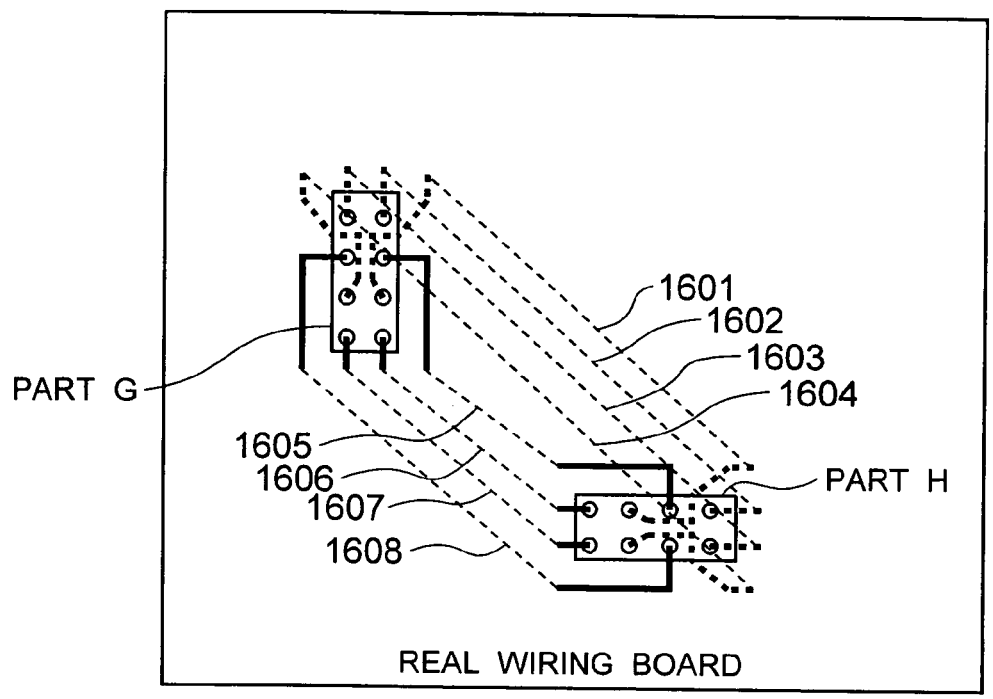
FIGS. 16A–16B explain the wiring processing unit between drawing wires having the wiring constraint.
Figure 16B:
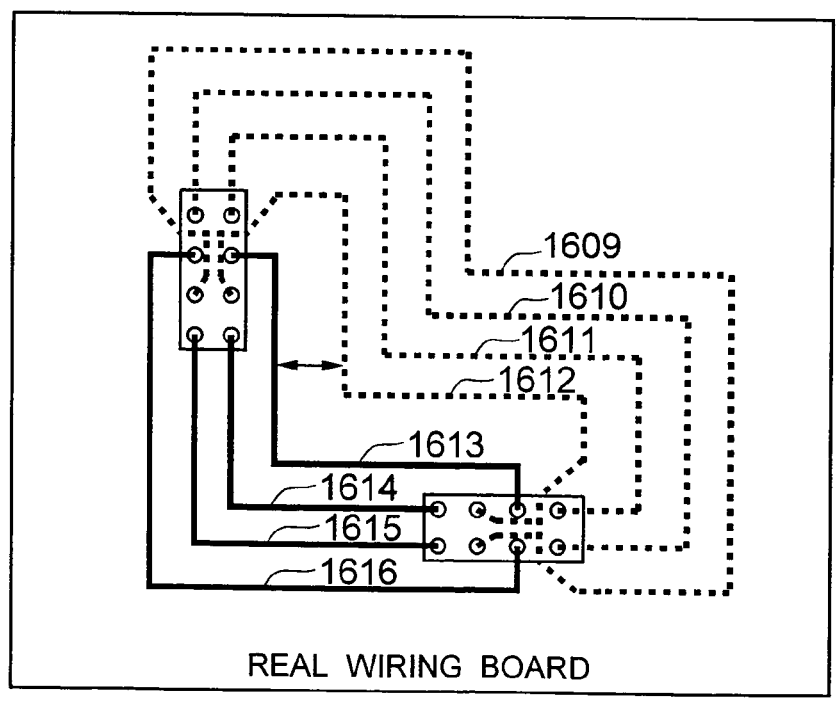

Moreover, FIGS. 16A–16B explain operation of the wiring processing unit 107 between the draw wires when the wiring board has a wiring constraint on the adjacent signals. FIG. 16A shows the state in which the draw wiring processing is complete and the draw wiring routes are fed back to the real wiring board. Moreover, 1601 to 1604 show a signal group Y while 1605 to 1608 show a signal group X. It should be noted that there is a wiring constraint shown in FIG. 14 on the signal group X and the signal group Y. FIG. 16B shows the state after wiring processing between the draw wires is performed under the constraints. Here, 1609 to 1612 are wiring routes of the signal group Y and 1613 to 1616 are wiring routes of the signal group X. Thus, the wire interval within the same group and the wire interval between the different groups are satisfied.

Figure 4:
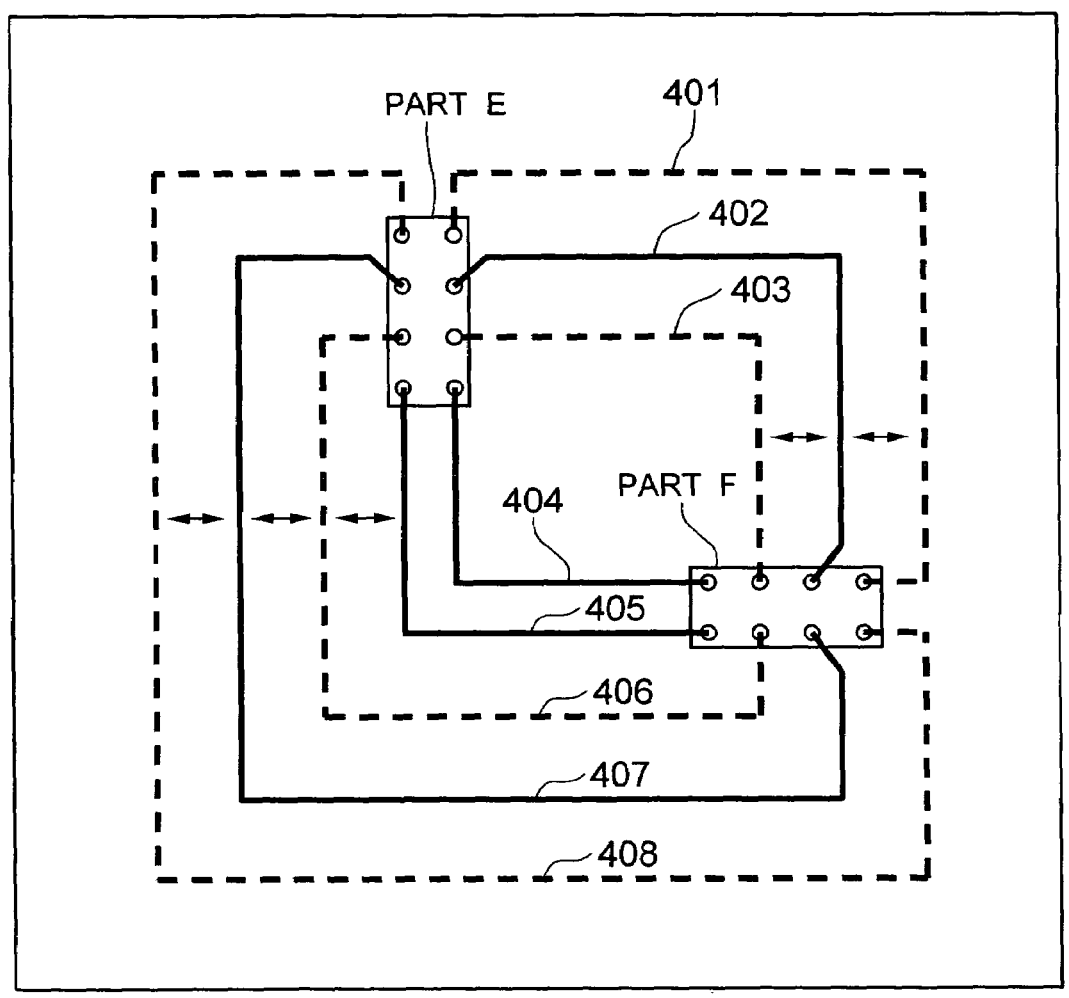
FIG. 4 shows a wiring example 3 in the conventional technique.

As has been described above, by using the draw wiring processing satisfying the wiring constraint and performing processing between the draw wires, the wiring area required for the wiring interval is reduced and the wiring mounting density is increased as compared to the result shown in FIG. 4.

(5) Embodiment 5

Figure 17:
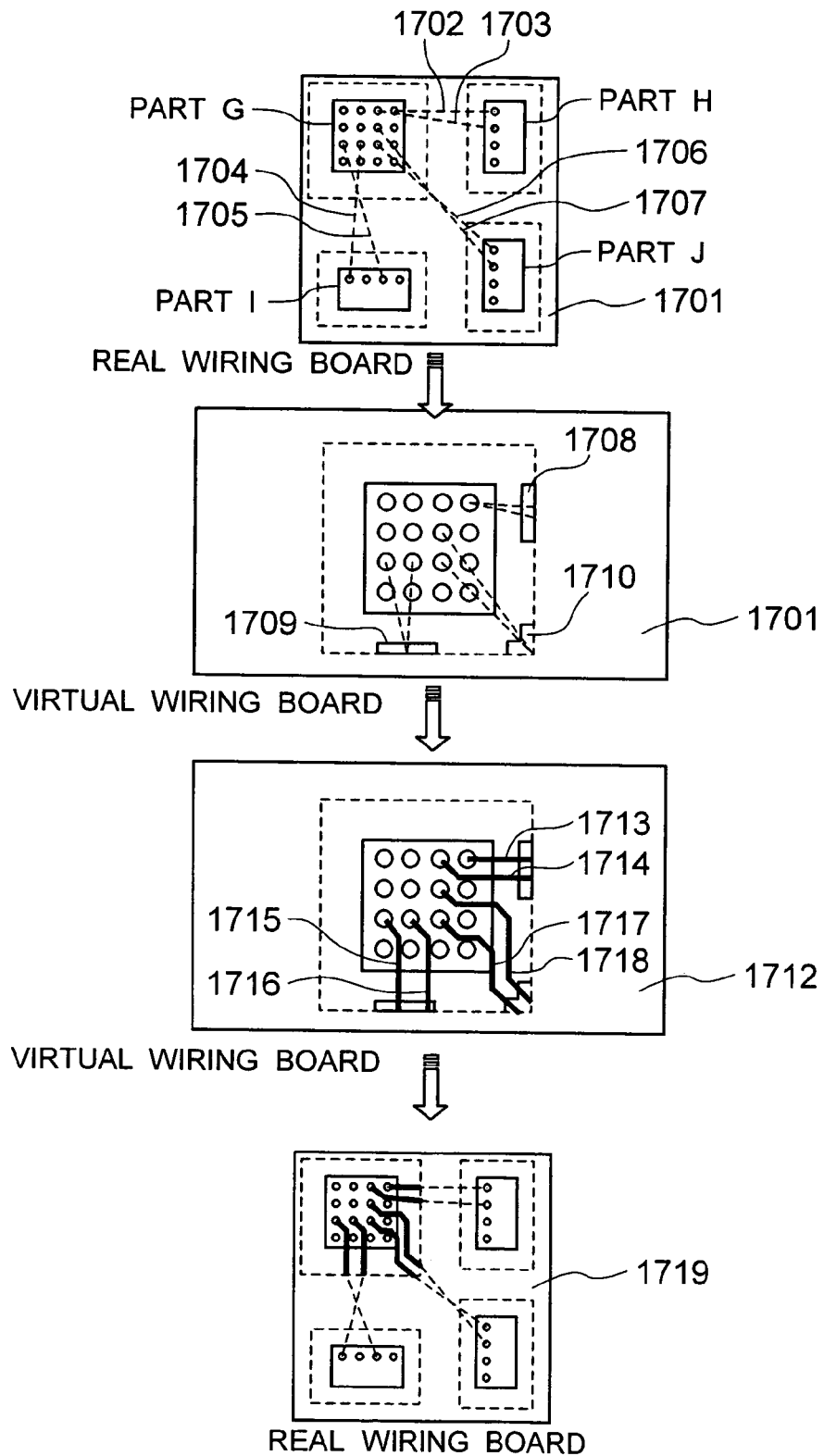
FIG. 17 explains a method for deciding draw wiring according to a fifth embodiment of the present invention.

Next, referring to FIG. 17, explanation will be given on the method for deciding the draw wiring by paying attention on one part as a fifth embodiment of the present invention.

1701 denotes a real wiring board on which parts G, H, I, J are arranged. Signals from the part G to the parts H–J are objects to be wired.

Here, the part G is extracted to the virtual wiring board in the part area. In this case, wire connection information 1702 to 1707 and peripheral areas 1708 to 1710 of the intersection point between the wire connection information and the outer shape of the part areas are also extracted. 1711 shows the state of the virtual wiring board after the extraction processing is complete.

Next, wiring between the part terminals of the signals to be subjected to the draw wiring and the intersecting areas is performed. Here, the wiring routes for the signal groups 1702 and 1703, 1704 and 1705, 1706 and 1707 having the same destination parts reach only arbitrary points in the intersecting areas 1708, 1709, 1710, respectively.

1712 shows the result of the virtual wiring board after the wiring is complete. Here, 1713 to 1718 are wiring results between the part terminals connected to the signals to be wired and the intersecting areas.

Next, feedback processing to the real wiring board is performed. 1719 shows the result of the real wiring board after the feedback processing to the real wiring board is complete.

It should be noted that when attention is paid on one part, there is also a method for deciding a wiring route in a part area on the real wiring board instead of the virtual wiring board.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A wiring route deciding system for a wiring board containing a multi-pin part, the system comprising: an input unit for receiving wiring board and wire connection information, wiring constraint information, and wiring setting information; a draw wiring processing unit for deciding a wiring route of a draw wiring from a part pin to a part periphery boundary according to the various wiring information inputted by the input unit; an inter-draw wire wiring processing unit for deciding a wiring route between end points of the wiring route of a draw wiring decided by the draw wiring processing unit; and an output unit for outputting a wiring route information decided by the draw wiring processing unit and the inter-draw wire wiring processing unit, wherein the draw wiring processing unit includes:
an extraction processing unit for cutting out one or more parts connected to a net according to part areas, the one or more parts being expanded by a wiring margin area around the parts, from a real wiring board and arranging them onto a virtual wiring board;
an arrangement processing unit for performing an arrangement such that the direction of each of the parts and pin arrangement are appropriate on the virtual wiring board;
a wiring processing unit for deciding a wiring route between the parts on the virtual wiring board and a draw wiring information in the part areas; and
a feedback processing unit for cutting out a draw wiring information in the part areas decided by the wiring processing unit on the virtual wiring board, such part areas being previously cut out by the extraction processing unit from the real wiring board, and performing feedback processing of the draw wiring information to the real wiring board.

2. The wiring route deciding system as claimed in claim 1, wherein the feedback processing unit returns the draw wiring information to the real wiring board by rotating the draw wiring information to the direction on the previous real wiring board and decides the draw wiring shape.

3. The wiring route deciding system as claimed in claim 2, wherein the draw wiring processing unit includes a virtual wiring board display/instruction unit for displaying the draw wiring result on the virtual wiring board and correcting the arrangement position and the direction of the parts, the draw wiring direction, the wiring layer, and the wiring route, or giving these information as instruction information so as to again perform the draw wiring processing.

4. The wiring route deciding system as claimed in claim 1 wherein the wiring processing unit in the draw wiring processing unit and the inter-draw wire wiring processing unit decide a wiring route considering the wiring constraint on the adjacent signals.

5. A wiring route deciding method for a wiring board containing a multi-pin part, the method comprising: an input step for receiving wiring board and wire connection information, wiring constraint information, and wiring setting information; a draw wiring processing step for deciding a wiring route of a draw wiring from a part pin to a part periphery boundary according to the various wiring information received in the input step; an inter-draw wire wiring processing step for deciding a wiring route between end points of the wiring route of a draw wiring decided by the draw wiring processing step; and an output step for outputting a wiring route information decided in the draw wiring processing step and the inter-draw wire wiring processing step, wherein the draw wiring processing step includes:

an extraction processing step for cutting out one or more parts connected to a net according to part areas, the one or more parts being expanded by a wiring margin area around the parts, from a real wiring board and arranging them onto a virtual wiring board;

an arrangement processing step for performing an arrangement such that the direction of each of the parts and pin arrangement are appropriate on the virtual wiring board;

a wiring processing step for deciding a wiring route between the parts on the virtual wiring board and a drawing wiring information in the part area; and a feedback processing step for cutting out a draw wiring information in the part areas decided by the wiring processing step on the virtual wiring board, such part areas being previously cut out by the extraction processing step from the real wiring board, and performing feedback processing of the draw wiring information to the real wiring board.

6. A wiring route deciding method as claimed in claim 5, wherein the feedback processing step returns the draw wiring information to the real wiring board by rotating the draw wiring information to the direction on the previous real wiring board and decides the draw wiring shape.

7. The wiring route deciding method as claimed in claim 6, wherein the draw wiring processing step includes a virtual wiring board display/instruction step for displaying the draw wiring result on the virtual wiring board and correcting the arrangement position and the direction of the parts, the draw wiring direction, the wiring layer, and the wiring route, or giving these information as instruction information so as to again perform the draw wiring processing.

8. A wiring route deciding method as claimed in claim 5 wherein the wiring processing step in the draw wiring processing step and the inter-draw wire wiring processing step decide a wiring route considering the wiring constraint on the adjacent signals.

* * * * *